United States Patent [19]
Sakamoto et al.

[11] Patent Number: 6,065,129
[45] Date of Patent: May 16, 2000

[54] CLOCK SIGNAL DETECTION CIRCUIT

[75] Inventors: Hisaya Sakamoto; Akihiko Sugata; Tetsuya Kiyonaga; Akimitsu Miyazaki, all of Kawasaki, Japan

[73] Assignee: Fujitsu Limited, Kawasaki, Japan

[21] Appl. No.: 09/089,508

[22] Filed: Jun. 3, 1998

[30] Foreign Application Priority Data

Jan. 12, 1998 [JP] Japan ................................ 10-003686

[51] Int. Cl.[7] ........................................................ G06F 1/04
[52] U.S. Cl. ............................. 713/500; 713/503; 713/600
[58] Field of Search .................................... 713/500, 503, 713/600

[56] References Cited

U.S. PATENT DOCUMENTS

| | | | |
|---|---|---|---|
| 4,507,544 | 3/1985 | Jones ........................................ | 219/209 |
| 5,394,490 | 2/1995 | Kato et al. ............................... | 385/14 |
| 5,442,475 | 8/1995 | Bausman et al. ........................ | 359/140 |
| 5,563,538 | 10/1996 | Mukoujima .............................. | 327/116 |
| 5,598,389 | 1/1997 | Nakano et al. .......................... | 369/48 |

*Primary Examiner*—Dennis M. Butler
*Attorney, Agent, or Firm*—Staas & Halsey

[57] ABSTRACT

A clock signal detection circuit includes a diode to which a clock signal is applied as an input. If a voltage VD IN on the anode side of the diode is greater than a voltage VD OUT on the cathode side, the clock signal is fed into a transmission line and arrives at a reflecting load upon elapse of a prescribed delay time. When the voltage VD IN on the anode side of the diode becomes smaller than the voltage VD OUT on the cathode side, the clock signal is reflected by the reflecting load and returns to the cathode of the diode through the transmission line. This introduction and reflection of the clock signal is repeated at the clock signal period so that the amplitude on the output side of the diode is enlarged, thereby making it possible to obtain, from an averaging circuit, a clock detection voltage substantially equal to the amplitude value of the clock signal.

13 Claims, 14 Drawing Sheets

CLOCK SIGNAL DETECTION CIRCUIT

BACKGROUND OF THE INVENTION

This invention relates to a clock signal detection circuit and, more particularly, to a clock signal detection circuit used to detect interruption of a light signal input in the light receiver of high-speed digital communication system.

The light receiver of a high-speed optical communication system converts a data waveform distorted by transmission or a data waveform distorted by noise to a clean signal waveform. The light receiver performs so-called data and clock regeneration. When data is to be regenerated, the light receiver extracts and regenerates a clock signal from the received data signal and performs the regeneration of the data by a discriminator using the generation timing of the clock signal as a reference.

Such an optical communication system has a variety of fault detection functions for monitoring whether the system is operating normally and discovering faulty points when anomalies occur. Among these functions, one that is for detecting whether a light signal is being received, namely a function for detecting interruption of the light signal, is essential for the light receiver and is required to operate normally in order to find the locations of faults.

FIG. 16 is a block diagram showing the construction of a light receiver in an optical communication system. The light receiver includes a light-receiving element 100 for converting a light signal to an electric signal, an equalizing amplifier circuit 200 for equalizing and amplifying a 10-Gbps data signal, for example, output by the light-receiving element 100, a timing extraction unit 300 for extracting a clock signal, which has a frequency the same as that of the bit rate, from the data signal that has been equalized and amplified, a discriminator 400 for discriminating "1" and "0" logic of the data signal using the clock signal output by the timing extraction unit 300, and a clock signal detector 500 for detecting the amplitude of the clock signal extracted by the timing extraction unit 300. The clock signal detector 500 is capable of detecting interruption of the optical input by comparing the clock signal amplitude and a reference.

In operation, a light signal that has arrived through an optical fiber is converted to an electric signal by the light-receiving element 100. The electric signal is equalized and amplified by the equalizing amplifier circuit 200. The timing extraction unit 300 extracts a clock signal CLK from the equalized waveform to trigger the discriminator 400. The latter determines whether the equalized waveform is indicative of "0" or "1" at the sampling timing, thereby reproducing the original code pulses (data) and outputting the same. Since there is a change in delay time in regard to transmission through the transmission line, a clock signal synchronized to the received data signal is regenerated and the discriminator 400 is triggered by the clock signal.

FIG. 17 is a block diagram showing the construction of the timing extraction unit. The timing extraction unit includes a data edge detector 110 for detecting leading and trailing edges of the data signal, a bandpass filter (BPF) 111, which has a center frequency identical with the bit rate of the data and a characteristic exhibiting a very high Q, which is generally on the order of 1000, and a limiter amplifier 112 for amplifying and shaping the waveform of the BPF output. FIG. 18 is a diagram showing the f characteristic of the BPF 111, where $f_0$ represents the center frequency of the BPF and $\Delta f$ the 3 dB bandwidth of the BPF 111. Accordingly, Q is given by the following:

$$Q = f_0/\Delta f$$

Though the circuits are not shown, the data edge detector 110 includes a branching circuit for branching the data signal in two directions, a delay circuit for delaying, by a prescribed length of time, one of the branched data signals, and an EX-OR (exclusive-OR) circuit for taking the exclusive-OR between the data signal and the output signal of the delay circuit to generate an edge signal having pulses at the leading and trailing edges of the data signal.

FIG. 19 is a waveform diagram showing the operation of the components in the timing extraction unit. The data edge detector 110 generates pulses at the leading and trailing edges of the data signal, the bandpass filter 111 extracts the clock component, which has a frequency identical with the bit rate of the data, from the output of the data edge detector 110, and the limiter amplifier 112 amplifies and shapes the waveform of the clock component.

In parallel with the above-described operation, the clock detector 500 detects the amplitude of the clock signal extracted by the timing extraction unit 300, compares the clock signal amplitude with a reference and outputs a light-input interruption alarm signal if the clock signal amplitude is less than the reference. The S/N ratio of the data signal output by the equalizing amplifier 200 deteriorates if there is a decline in the light input power. If the S/N ratio of the data input signal deteriorates, then the amplitude of the clock signal extracted by the timing extraction unit 300 falls. As a result, the clock signal detector 500 is capable of generating the light-input interruption alarm signal upon detecting the interruption of the light signal by comparing the clock signal amplitude extracted by the timing extraction unit 300 with the reference.

Certain problems arise when detecting the clock signal amplitude. These problems will now be described.

Extraction of the clock signal is performed by coupling the timing extraction unit 300 and the clock signal detector 500 via a capacitor 121, as illustrated in FIG. 20A. Consequently, the clock signal amplitude that can be utilized to detect light input and interruption of the light input becomes half of peak to peak, as shown in FIG. 20B, as a result of which detection efficiency declines. Accordingly, in order detection interruption of the light input and generate an alarm, it is necessary to provide an amplifier capable of high-speed operation and having a high gain. In addition, output linearity (limiter amplitude value) must be improved to assure sufficient amplitude. However, such an amplifier generally is costly and consumes a large amount of power.

Further, an effective method of detecting clock signal amplitude is to regenerate the DC component of the clock signal as in the manner of a diode clamper. With a diode clamper, however, the effects of parasitic capacitance and the like become more pronounced when the clock signal frequency is on the gigahertz order, as a result of which satisfactory direct current regeneration can no longer be performed.

Further, the method of detecting clock signal amplitude generally is a peak detection method using a diode. However, if the bit rate exceeds several gigahertz, bandwidth deterioration occurs owing to the parasitic capacitance of the diode, as a consequence of which detection efficiency declines.

SUMMARY OF THE INVENTION

Accordingly, an object of the present invention is to provide a clock signal detection circuit capable of generating a DC voltage substantially equal to the amplitude value of a clock signal so that the clock signal amplitude can be detected in a highly efficient manner.

Another object of the present invention is to provide a clock signal detection circuit in which supply of power other than ground basically is not required, whereby it is possible to reduce power consumption.

A further object of the present invention is to provide a clock signal detection circuit in which a costly amplifier or the like is not required and clock detection output is large.

In accordance with the present invention, the foregoing objects are attained by providing a clock signal detection circuit for detecting a clock signal, comprising a transmission circuit for transmitting a clock signal and a reflected signal obtained by reflecting the clock signal, and an averaging circuit provided on the output side of the transmission circuit, the transmission circuit including a diode to which a clock signal is input, a transmission line of impedance $Z_O$ having one end connected to the diode, and a reflecting load of impedance $Z_L$ ($Z_L \neq Z_O$) connected to another end of the transmission line, the clock signal being amplified using reflection of the clock signal in the reflecting load, and the averaging circuit outputting a clock detection voltage.

Other features and advantages of the present invention will be apparent from the following description taken in conjunction with the accompanying drawings

BRIEF DESCRIPTION OF THE DRAWINGS

DESCRIPTION OF THE PREFERRED EMBODIMENTS (A) Overview of the present invention FIG. 1 is a diagram for describing an overview of the present invention. Shown in FIG. 1 are a clock signal input circuit 1 for inputting a clock signal, which has been extracted by a timing extraction unit (not shown), to the detection side, a transmission circuit 2 for transmitting a clock signal and a reflected signal obtained by reflecting the clock signal, and an averaging circuit 3 provided on the output side of the transmission circuit 2. The transmission circuit 2 includes a diode 11 to which the clock signal is input, a transmission line 12 of impedance $Z_O$ having one end connected to the diode 11, and a reflecting load 13 of impedance $Z_L$ ($Z_L \neq Z_O$) connected to the other end of the transmission line 12. If a voltage VD IN on the anode side of the diode 11 is greater than a voltage VD OUT on the cathode side of the diode, the clock signal is fed into the transmission line 12 and arrives at the reflecting load 13 upon elapse of a prescribed delay time. When the voltage VD IN on the anode side of the diode 11 becomes smaller than the voltage VD OUT on the cathode side, the clock signal is reflected by the reflecting load 13 and returns to the cathode of the diode 11 through the transmission line 12. This introduction and reflection of the clock signal is repeated at the clock signal period so that the amplitude on the output side of the diode is enlarged, thereby making it possible to extract, from the averaging circuit 3, a DC voltage substantially equal to the amplitude value of the clock signal. With the clock signal detecting circuit described above, supply of power other than ground basically is not required, whereby it is possible to reduce power consumption. Moreover, a costly amplifier or the like is not required.

Figure 1:
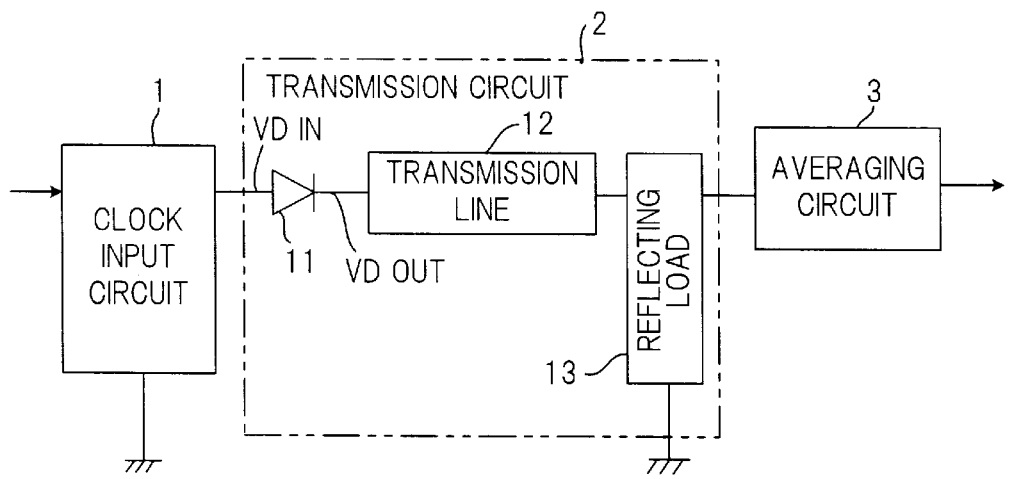
FIG. 1 is a diagram useful in describing a solution provided by the present invention.

A high-impedance reflecting-type clock signal detecting circuit is constructed by using a resistor as the reflecting load 13 of FIG. 1, connecting one end of this resistor serially to the other end of the transmission line 12, and capacity-grounding the other end of the resistor. A high-impedance reflecting-type clock signal detecting circuit is similarly constructed by using an inductance element as the reflecting load 13, connecting one end of this inductance element serially to the other end of the transmission line 12, and capacity-grounding the other end of the inductance element. A low-impedance reflecting-type clock signal detecting circuit is constructed by using a capacitor as the reflecting load 13, connecting one end of this capacitor serially to the other end of the transmission line 12, and grounding the other end of the capacitor.

If the wavelength of the clock signal is represented by λ, then the length of the transmission line in the high-impedance reflecting-type clock signal detecting circuit is made 0.4 λ~0.43 λ. Such an arrangement makes it possible to enlarge the clock detection voltage. If the wavelength of the clock signal is represented by λ, then the length of the transmission line in the low-impedance reflecting-type clock signal detecting circuit is made 0.15 λ~0.20 λ. This also makes it possible to enlarge the clock detection voltage.

(B) Principle of the present invention

Figure 2:
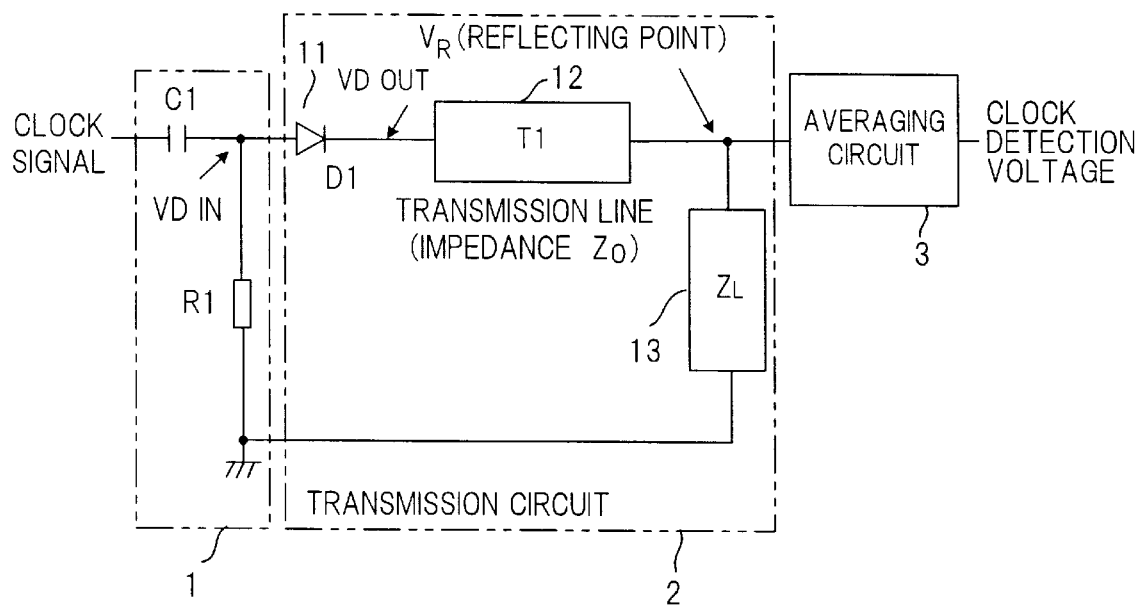
FIG. 2 is a diagram (of the construction of a clock detecting circuit) useful in describing the principles of the present invention.
Figure 3:
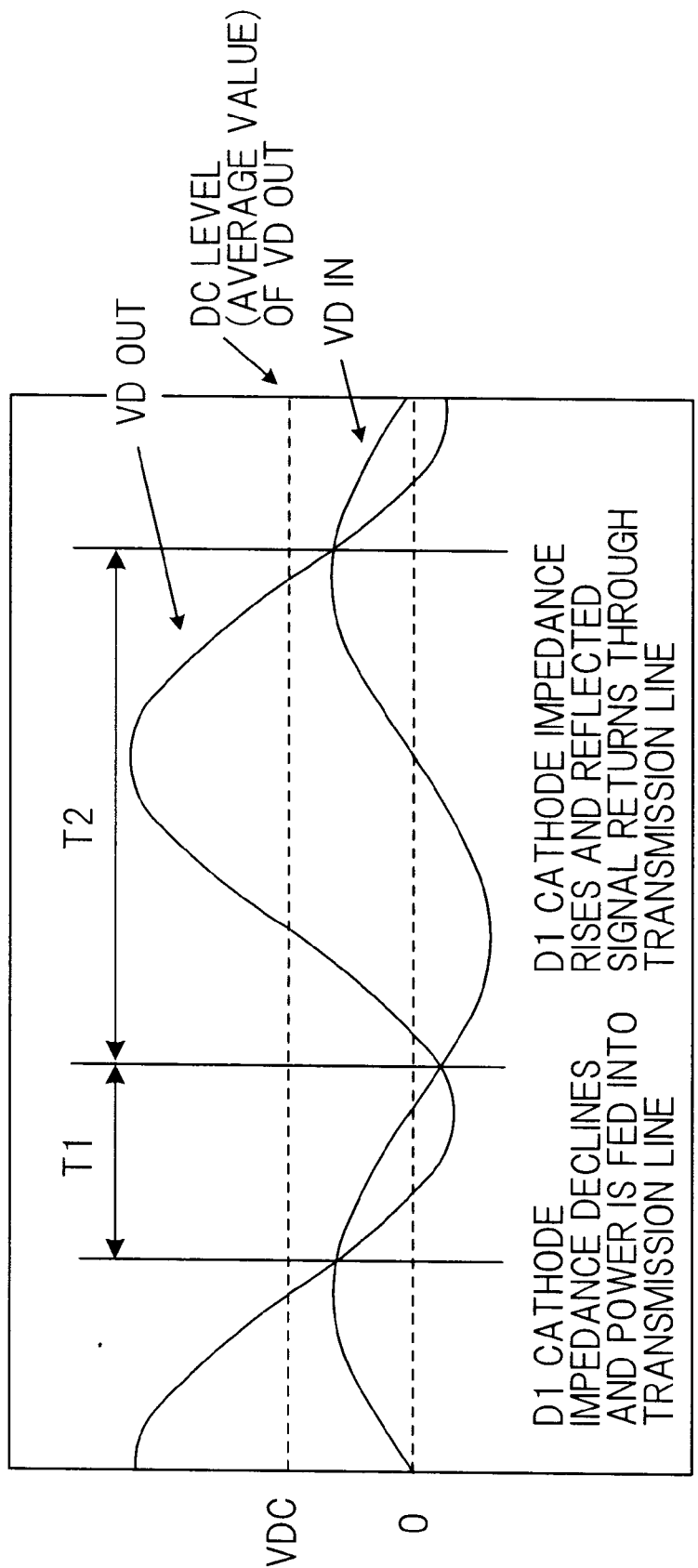
FIG. 3 is a diagram useful in describing the operation of a diode included in the circuit of FIG. 2.
Figure 4:
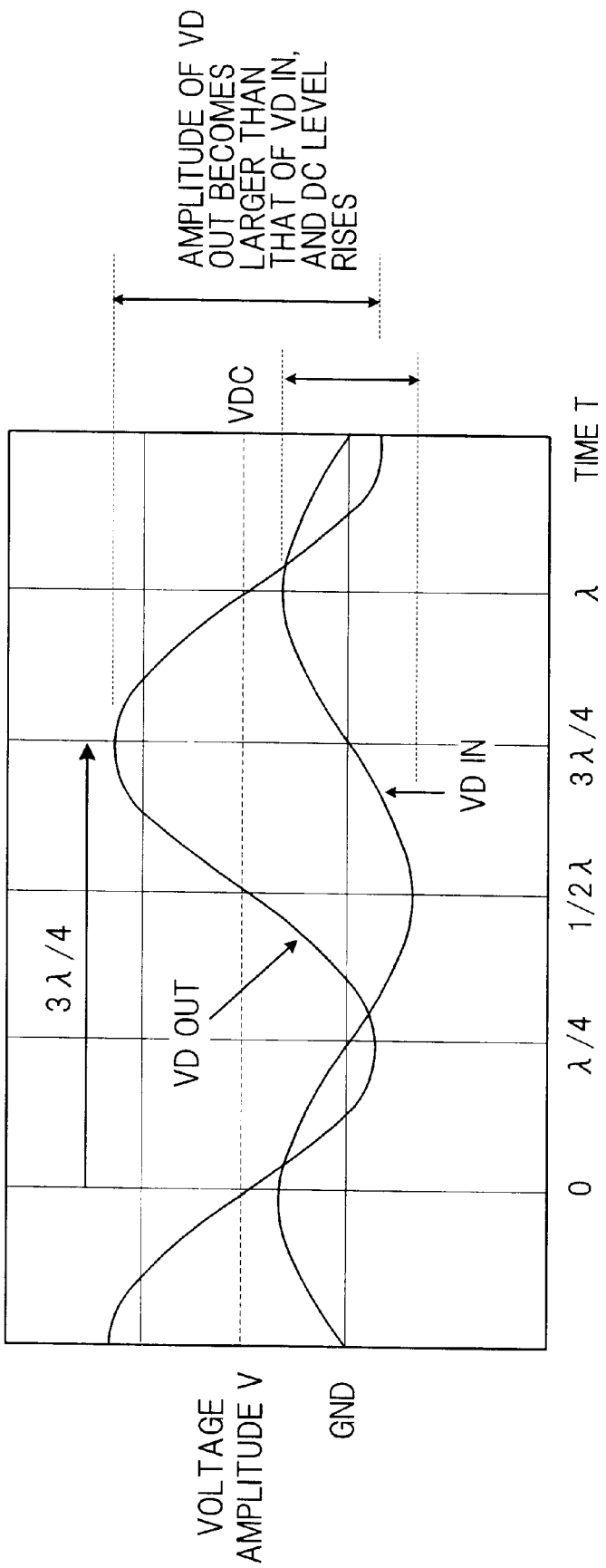
FIG. 4 is a diagram showing the phase relationship of an input signal and an output signal.

FIG. 2 is a diagram for describing the principle of the present invention, and FIG. 3 is a diagram useful in describing the operation of the diode 11, and FIG. 4 is a diagram showing the phase relationship of the input signal VD IN and output signal VD OUT of the diode.

Shown in FIG. 2 are the clock signal input circuit 1, which comprises a coupling capacitor C1 and a resistor R1, for inputting a clock signal, which has been extracted by a timing extraction unit (not shown), to the detection side, the transmission circuit 2 for transmitting, in mutually opposing directions, a clock signal and a reflected signal obtained by reflecting the clock signal, and the averaging circuit 3 provided on the output side of the transmission circuit 2.

The transmission circuit 2 includes the diode 11 having an anode terminal to which the clock signal is input, the transmission line 12 of impedance $Z_O$ having one end connected to the cathode terminal of the diode 11, and the reflecting load 13 of impedance $Z_L$ ($Z_L \neq Z_O$) connected to the other end of the transmission line 12.

When the clock signal (input signal) VD IN enters the anode terminal of the diode 11, the output signal VD OUT appears at the cathode of the diode 11. The output signal VD OUT of the diode 11 reaches the reflecting load 13 through the transmission line 12. If the relationship between the impedance $Z_O$ of the transmission line 12 and the impedance $Z_L$ of the reflecting load 13 is such that $Z_O << Z_L$ or $Z_O >> Z_L$ holds, the signal that has arrived via the transmission line 12 is reflected at a reflection point $V_R$. The signal reflected at the reflection point $V_R$ is sent back to the cathode terminal of the diode 11 in the opposite direction through the transmission line 12.

In an interval T1 in which the input signal VD IN subsequently surpasses the output signal VD OUT, as shown in FIG. 3, the diode 11 turns on, the impedance at its cathode terminal declines, the output signal VD OUT is clamped and power is fed into the transmission line 12. In an interval T2 in which the input signal VD IN is less than the output signal VD OUT, the diode 11 turns off, the impedance at its cathode terminal rises ($>>Z_O$) and the signal reflected at the reflection point $V_R$ is again sent back to the cathode terminal of the diode 11 in the opposite direction through the transmission line 12. The introduction of power and reflection is repeated at the period of the clock signal. More specifically, the diode 11 operates in two modes, namely a power introduction mode and a multiple reflection mode, in one period of the clock. Owing to this interaction, the amplitude of the output signal VD OUT increases and so does the DC component VDC, as a result of which the averaging circuit 3 is capable of outputting a large detection voltage that corresponds to the clock signal amplitude.

FIG. 4 is a diagram useful in describing the phase relationship between the input signal VD IN and output signal VD OUT in the steady state in a case where the output signal VD OUT lags behind the input signal VD IN by 3 λ/4, where λ represents the wavelength of the clock signal. When the transmission line length of the transmission line 12 has been set in such a manner that the output signal VD OUT is delayed by 3 λ/4 with respect to the input signal VD IN, the amplitude of the output signal VD OUT can be enlarged and so can the DC component VDC. Accordingly, the detection efficiency of the clock signal can be raised by outputting the DC component (mean value) output signal VO OUT at this time.

(C) Embodiment (a) First embodiment

Figure 5:
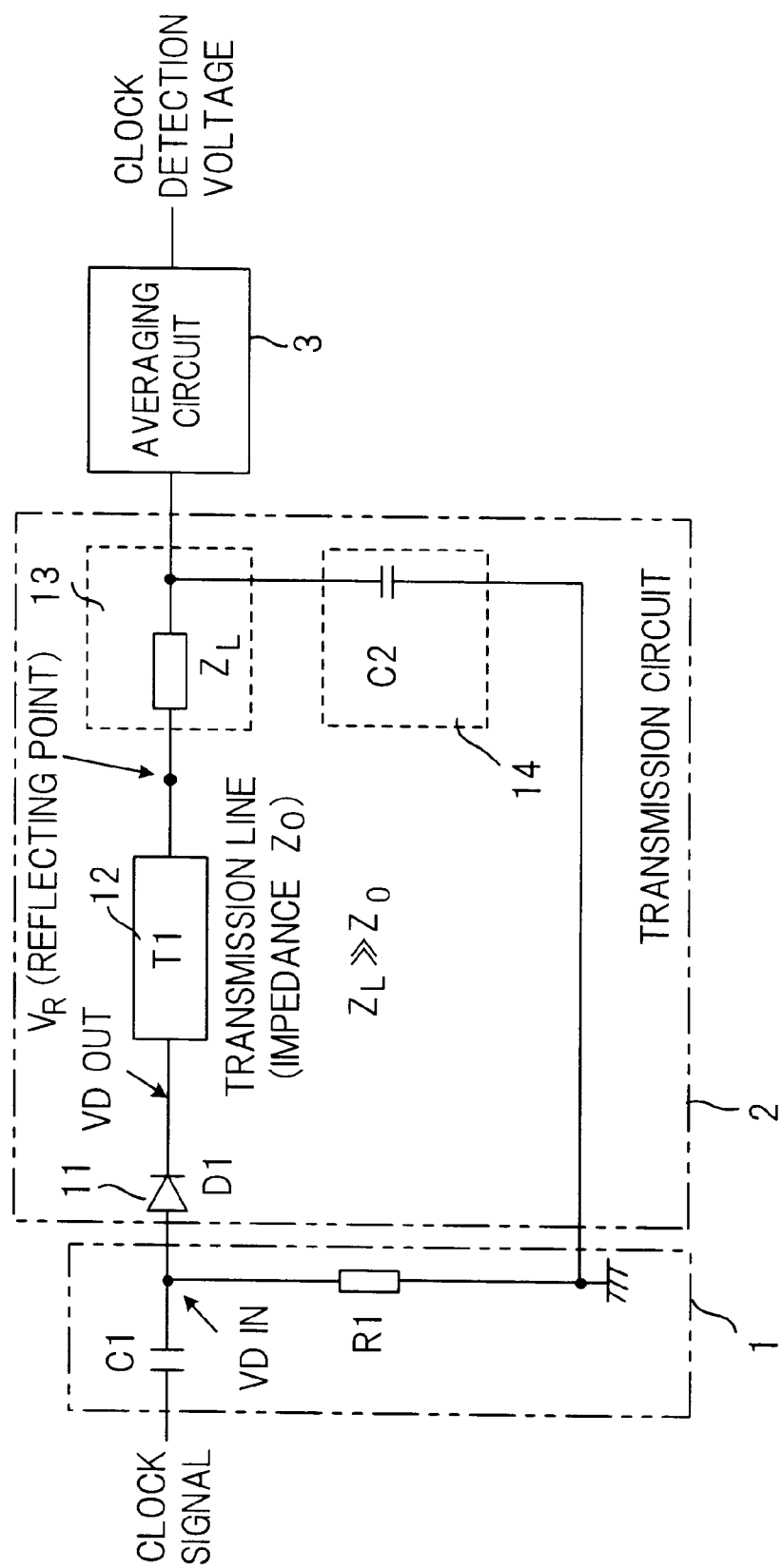
FIG. 5 is a diagram illustrating a high-impedance reflecting-type clock signal detecting circuit according to a first embodiment of the present invention.

FIG. 5 is a diagram illustrating an embodiment of a clock signal detecting circuit in which the reflecting load is a high impedance. Components identical with those of the arrangement shown in FIG. 2 are designated by like reference characters.

Shown in FIG. 5 are the clock signal input circuit 1, which comprises the coupling capacitor C1 and the resistor R1, for inputting the clock signal, extracted by the timing extraction unit, to the detection side, the transmission circuit 2 for transmitting, in mutually opposing directions, the clock signal and the reflected signal obtained by reflecting the clock signal, and the averaging circuit 3 provided on the output side of the transmission circuit 2.

The transmission circuit 2 includes the diode 11 having an anode terminal to which the clock signal is input, the transmission line 12 of impedance $Z_O$ having one end connected to the cathode terminal of the diode 11, the reflecting load 13 of impedance $Z_L$ ($Z_L >> Z_O$) connected to the other end of the transmission line 12, and capacity ground 14 for capacity-grounding the other end of the reflecting load 13 by the capacitor C2.

Figure 6:
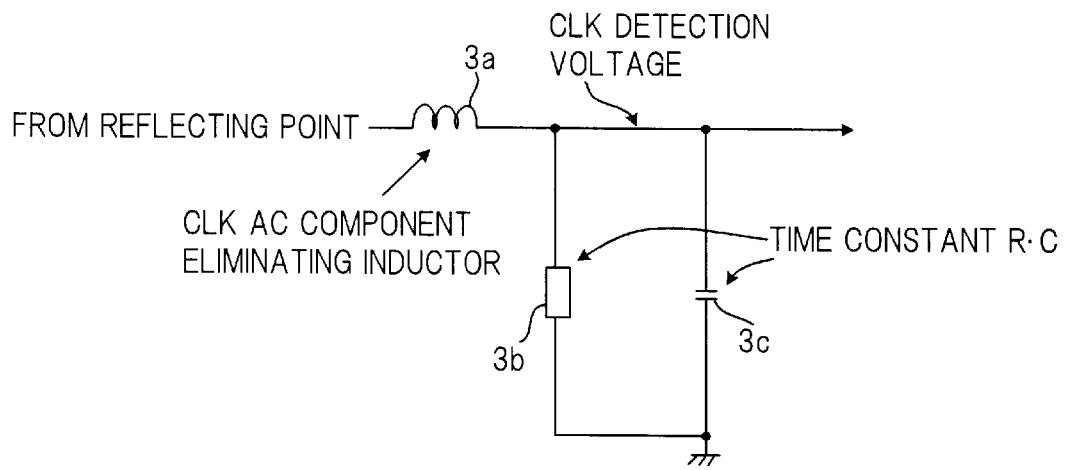
FIG. 6 is a diagram showing the construction of a clock averaging circuit.

As shown in FIG. 6, the averaging circuit 3 comprises an AC-component eliminating inductance element $3a$ one end of which is serially connected to the reflecting load 13, and a parallel circuit composed of a resistor $3b$ and capacitor $3c$ connected between the other end of the inductance element $3a$ and ground. A DC clock component (mean voltage) is output from the point at which the inductance element $3a$ and parallel circuit are connected. The parallel circuit decides the discharge time constant of the detection voltage.

In order for the diode 11 of the transmission circuit 2 to be turned on and off repeatedly at high speed, it is required that both the parasitic capacitance and ON voltage be small. A Schottky diode, therefore, is ideal for use as the diode 11.

Figure 7A:
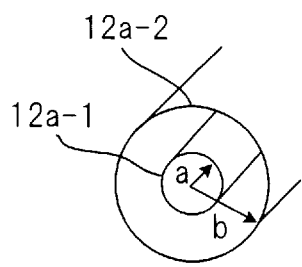
FIGS. 7A, 7B and 7C are diagrams useful in describing transmission lines.
Figure 7B:
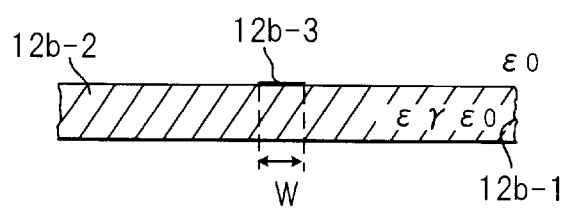
Figure 7C:
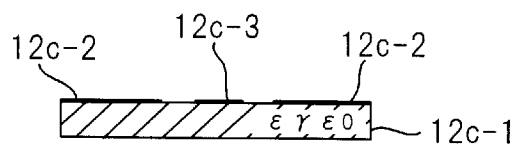

Since it is required that the transmission line 12 cause reflection when the impedance of the cathode of diode 11 is high, the impedance $Z_O$ of the diode should be on the order of 50~100 Ω. The transmission line 12 is constructed using a coaxial line, a microstrip line, a coplanar line or a delay line, etc. FIGS. 7A through 7C illustrate examples of transmission lines, in which FIG. 7A illustrates a coaxial line composed of an internal conductor 12$a$-1 and an external conductor 12$a$-2 of radii a and b, respectively, FIG. 7B a microstrip line obtained by building up a dielectric substrate 12$b$-2 on a ground conductor 12$b$-1 and disposing a strip conductor 12$b$-3 of width W on the substrate, and FIG. 7C a coplanar line obtained by disposing ground conductors 12$c$-2, 12$c$-2 on both sides of a dielectric substrate 12$c$-1 and disposing a strip conductor 12$c$-3 between the ground conductors 12$c$-2, 12$c$-2. The transmission line length will be described later as this is related to the impedance of the reflection point $V_R$. The load $Z_L$ of the reflecting load 13 is set high relative to the impedance $Z_O$ of the transmission line 12 (i.e., $Z_O << Z_L$). The high impedance is set by making the reflecting load a resistor or impedance element.

(b) Second Embodiment

Figure 8:
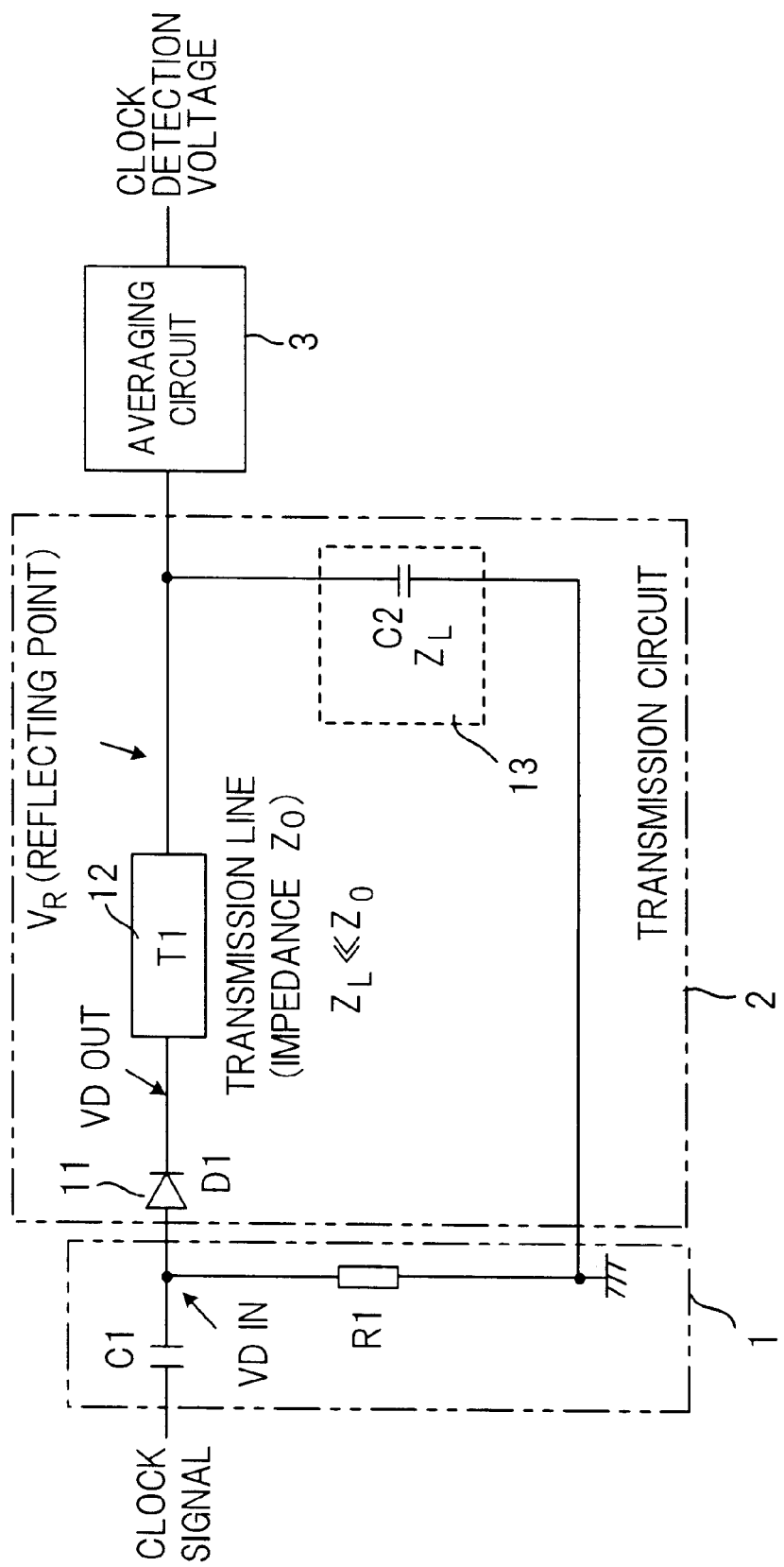
FIG. 8 is a diagram illustrating a low-impedance reflecting-type clock signal detecting circuit according to a second embodiment of the present invention.

FIG. 8 is a diagram illustrating an embodiment of a clock signal detecting circuit in which the reflecting load is a low impedance. Components identical with those of the arrangement shown in FIG. 2 are designated by like reference characters. This embodiment differs from that of the first embodiment in that the impedance of the reflecting load 13 is set to a low impedance ($Z_O >> Z_L$) relative to the impedance of the transmission line 12. To accomplish this, the reflecting load 13 is constructed by capacity-grounding the terminus of the transmission line 12 by a capacitor C2.

(D) Optimum length of transmission line

The transmission line length is calculated in such a manner that the clock signal detection voltage will be maximized in the embodiment (FIG. 5) in which the reflecting load has a high impedance and the embodiment (FIG. 8) in which the reflecting load has a low impedance.

Figure 9:
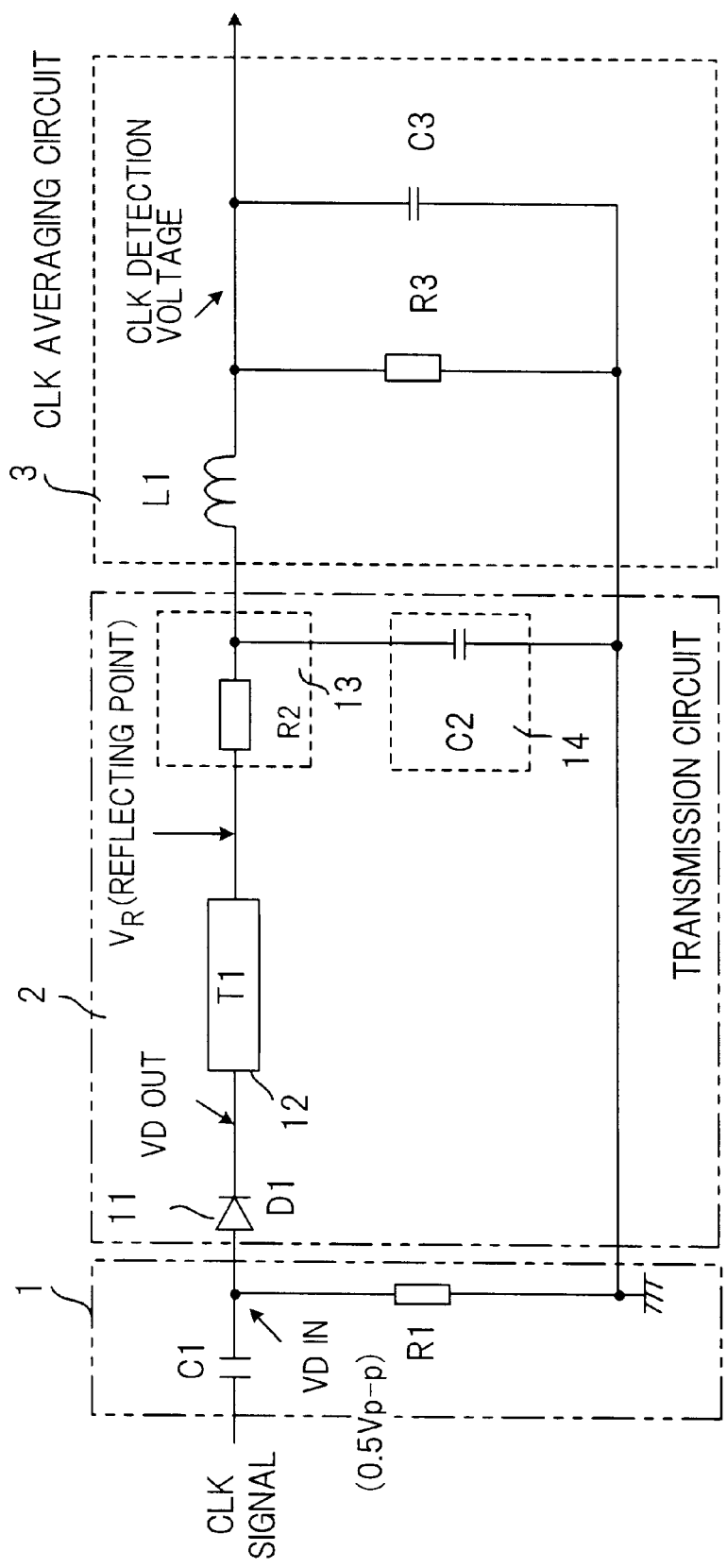
FIG. 9 is a diagram illustrating a simulation model (of high-impedance reflecting type)
Figure 10:
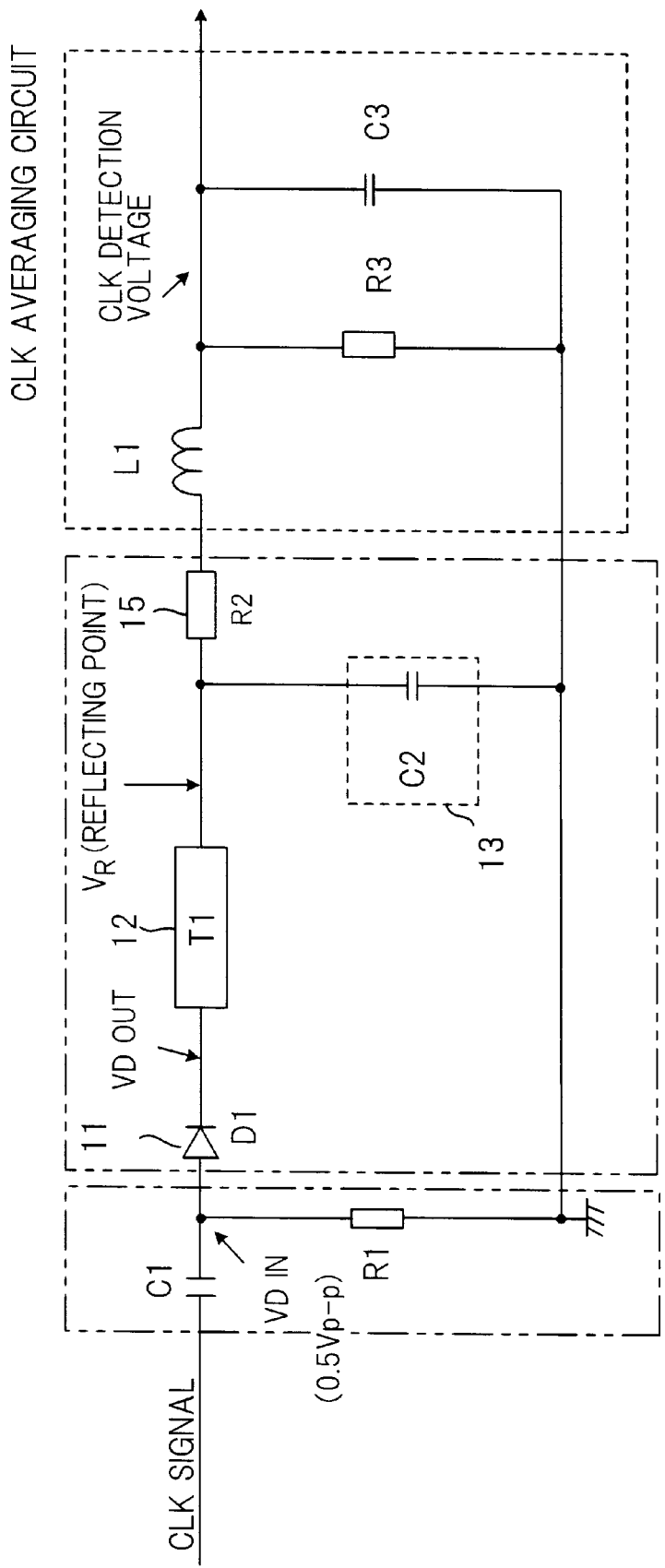
FIG. 10 is a diagram illustrating a simulation model (of low-impedance reflecting type)
Figure 11:
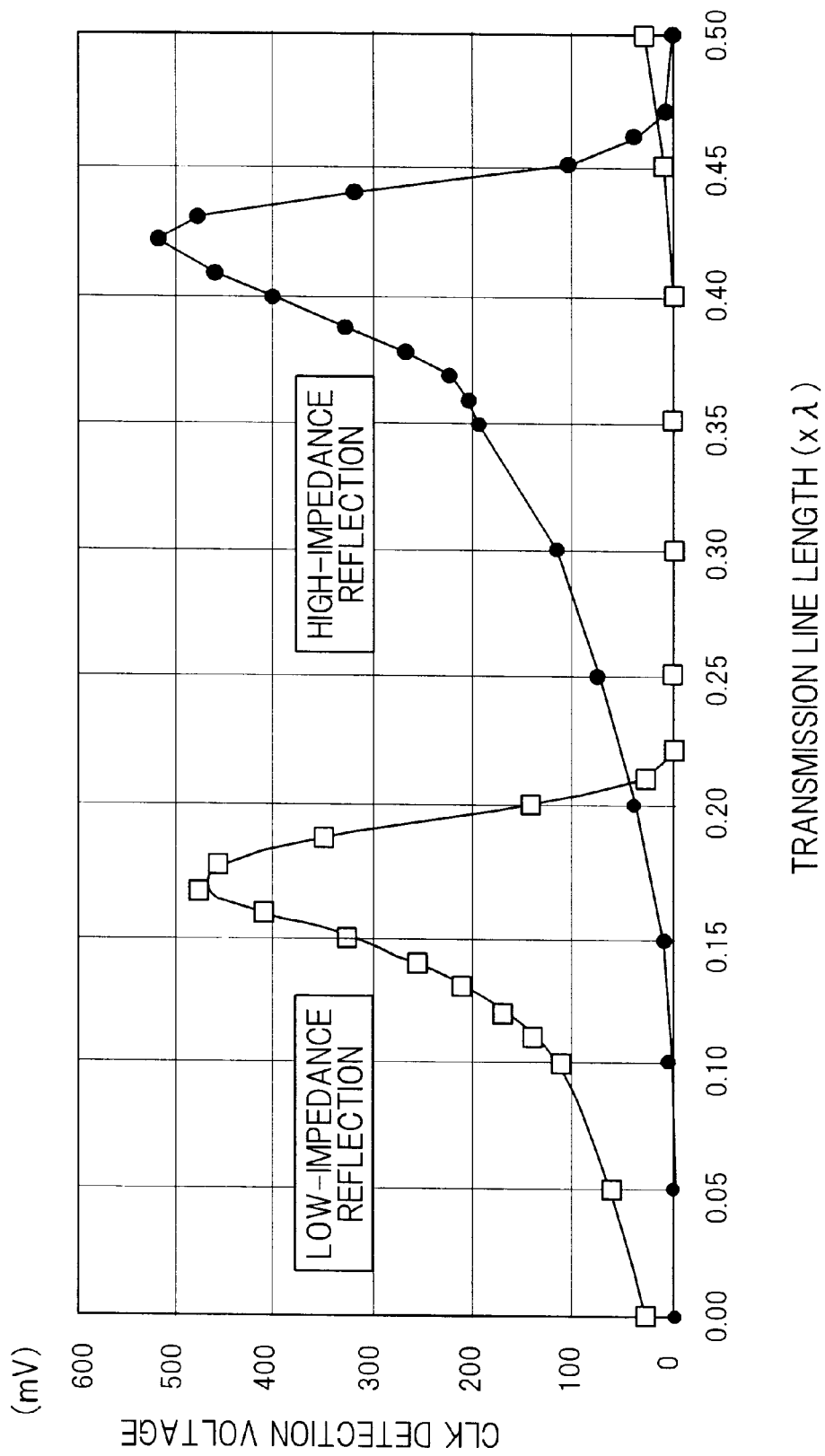
FIG. 11 is a diagram illustrating the results of simulations (with transmission line length as a parameter)

FIG. 9 shows a high-impedance reflecting-type clock detection circuit, and FIG. 10 illustrates a low-impedance reflecting-type clock detection circuit. Numeral 15 in FIG. 10 denotes an output resistor. FIG. 11 is a diagram illustrating the results of simulation obtained when transmission line length is adopted as a parameter in each of the models of FIGS. 9 and 10. If the length of the transmission line 12 is optimized based upon the simulation results, the clock signal detection voltage can be made 0.5 V with respect to a clock signal input having a peak-to-peak level of 0.5 Vp-p, and an efficiency of substantially 100% can be obtained.

Further, letting $\lambda$ represent the wavelength of the clock signal, the optimum transmission line length will be $0.42\times\lambda$ one way and $0.84\times\lambda$ round-trip in the case of the high-impedance reflecting-type clock detection circuit and $0.17\times\lambda$ one way and $0.34\times\lambda$ round-trip in the case of the low-impedance reflecting-type clock detection circuit. The reason why the optimum transmission line length of the low-impedance reflecting-type clock detection circuit is shorter is that phase is advanced by just $0.5\times\lambda$ at the time of reflection. If this phase advance is taken into account, the optimum transmission line length round-trip will be $0.84\times\lambda$, which agrees with that of the high-impedance clock detection circuit.

Thus, if the transmission line length is made $0.4\ \lambda\sim0.43\ \lambda$ in the case of the high-impedance reflecting-type clock detection circuit and $0.15\ \lambda\sim0.20\ \lambda$ in the case of the low-impedance reflecting-type clock detection circuit, then a large clock detection voltage can be obtained. Further, in order to reduce the length of the transmission line, the low-impedance reflecting-type arrangement (shown in FIGS. 8, 10) should be adopted.

(E) Optimum range of reflecting load impedance

The manner in which clock signal detection voltage varies was calculated using the impedance of the reflecting load as a parameter. The simulation models were the circuits of FIG. 9 and 10, with the clock signal conditions being a frequency of 10 GHz and an amplitude of 0.5 Vp-p.

(a) High-impedance reflection using resistor as reflecting load

Figure 12:
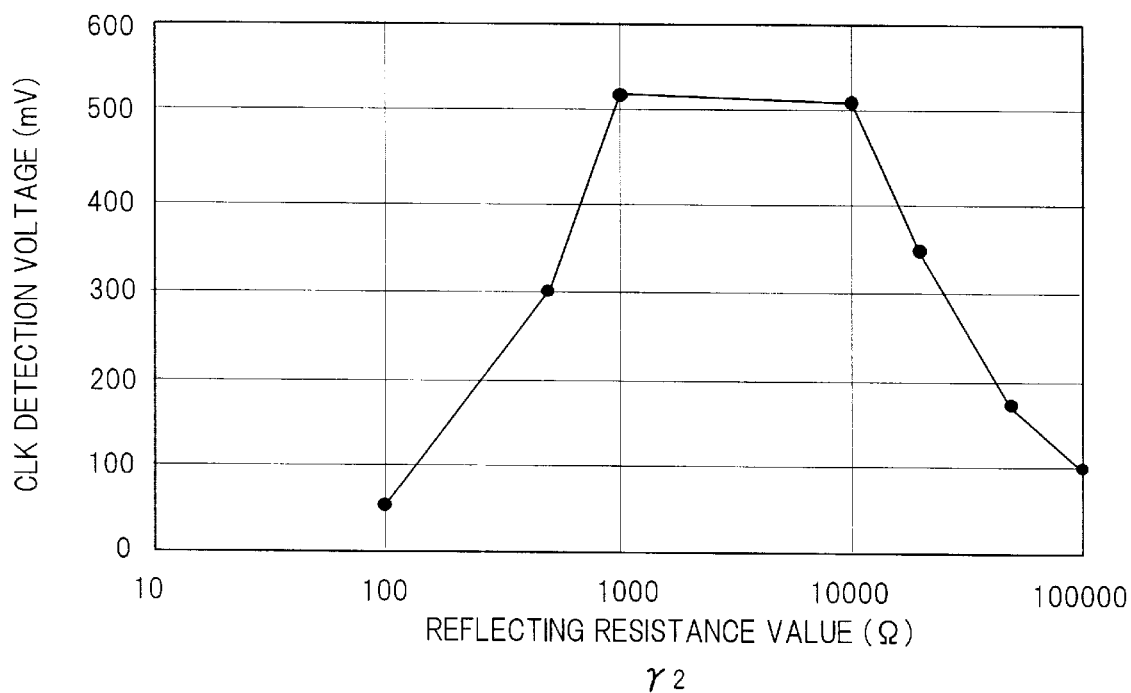
FIG. 12 is a diagram showing the relationship between a reflecting resistance value and clock detection voltage.

FIG. 12 is a diagram showing the relationship between clock detection voltage (mV) and reflecting resistance value ($\Omega$) in a case where the reflecting load 13 (FIG. 9) is made the resistor R2 (the resistance value of which is r2). The characteristic impedance $Z_O$ of the transmission line 12 is set at 80 $\Omega$. It will be understood from FIG. 12 that a satisfactory clock detection voltage is obtained if the reflecting resistance value r2 is made larger than the characteristic impedance $Z_O$ by a factor of ten or greater. If the resistance value r2 is made too large, however, the detection voltage obtained through potential division by the resistor R2 and resistor R3 in the averaging circuit 3 will decline.

Accordingly, the highest clock signal detection level is achieved when the reflecting resistance value is within the range 1~10 k$\Omega$. It should be noted that this range of resistance values is decided independently of the clock frequency.

Thus, a satisfactory clock detection voltage is obtained if the transmission line length is made $0.4\ \lambda\sim0.43\ \lambda$ and the reflecting resistance value r2 is set to be ten to 100 times larger than the specific impedance $Z_O$.

(b) High-impedance reflection using inductance element as reflecting load

Figure 13:
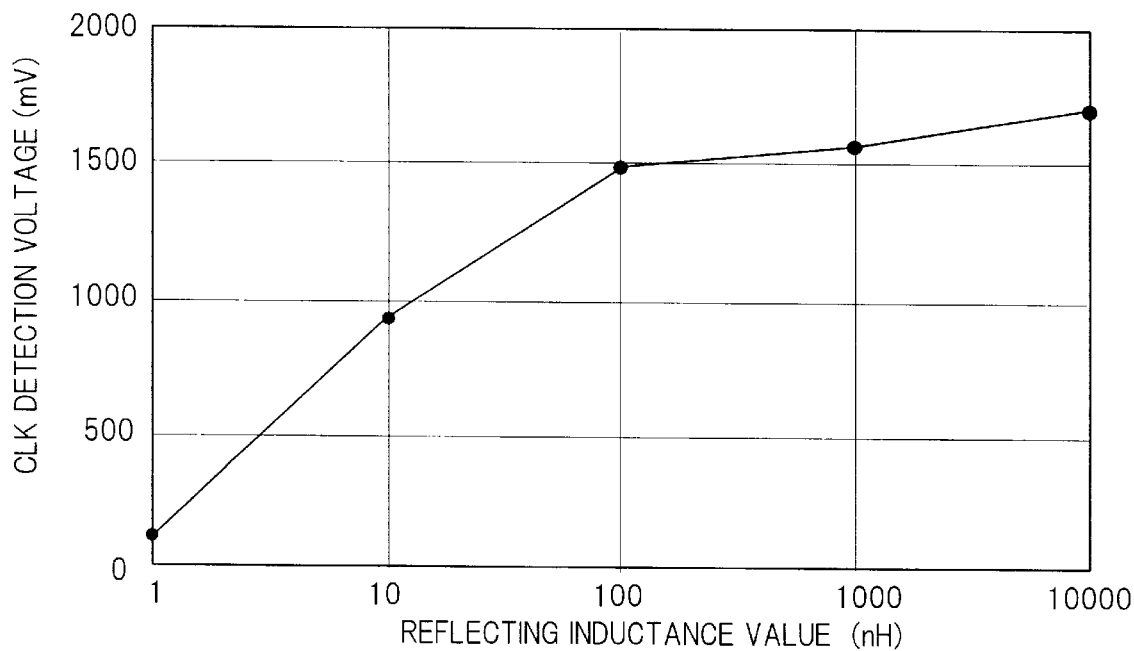
FIG. 13 is a diagram showing the relationship between a reflecting inductance and clock detection voltage.

FIG. 13 is a diagram showing the relationship between clock detection voltage (mV) and inductance (nH) in a case where the reflecting load 13 (FIG. 9) is made the inductance element L. The characteristic impedance $Z_O$ of the transmission line 12 is set at 80 $\Omega$. It will be understood from FIG. 13 that the clock detection voltage increases with an increase in inductance. If the inductance is made greater than 100 nH, a detection voltage that is more than threefold the input amplitude of the clock signal is obtained. This is a value that can be applied with a clock frequency of 10 GHz; if the clock frequency varies, so does the impedance.

Accordingly, the transmission line length is made $0.4\ \lambda\sim0.43\ \lambda$ and the reflecting impedance is decided in dependence upon the clock frequency in such a manner that the clock detection voltage will be maximized.

(c) Low-impedance reflection using capacitor as reflecting load

Figure 14:
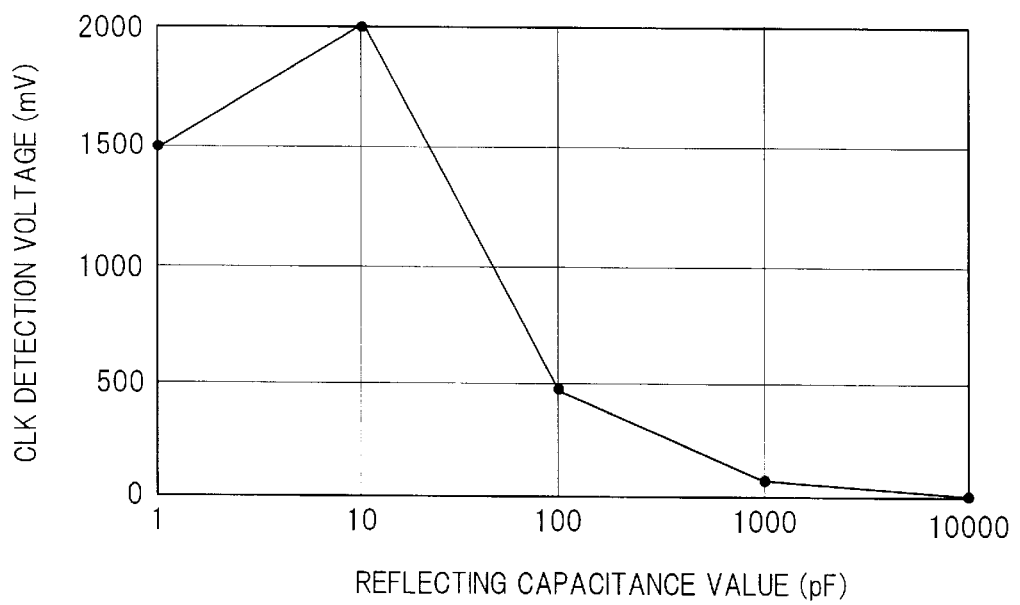
FIG. 14 is a diagram showing the relationship between a reflecting capacitance value and clock detection voltage.

FIG. 14 is a diagram showing the relationship between clock detection voltage (mV) and the capacitance (pF) of a reflecting capacitor in a case where the reflecting load 13 is made capacitor (FIG. 10). The characteristic impedance $Z_O$ of the transmission line 12 is set at 80 $\Omega$. It will be understood from FIG. 14 that a detection voltage greater than the input amplitude by factor of four is obtained when the capacitance is 10 pF, and that the detection voltage falls for other capacitance values. This is a value that can be applied with a clock frequency of 10 GHz; if the clock frequency varies, so does the optimum value.

Accordingly, the transmission line length is made $0.15\lambda\sim0.20\ \lambda$ and the reflecting capacitance value is decided in dependence upon the clock frequency in such a manner that the clock detection voltage will be maximized.

(F) Optimum value of resistor R3 in averaging circuit 3

The manner in which clock signal detection voltage varies was calculated using as the parameter the value r3 of the resistor R3 in the averaging circuit 3 of the high-impedance reflecting-type clock detection circuit. The clock signal conditions were a frequency of 10 GHz and an amplitude of 0.5 Vp-p, the characteristic impedance $Z_O$ of the transmission line 12 was 80 $\Omega$, and the resistance value r2 of the reflecting load was 10 to 100 times the characteristic impedance $Z_O$, e.g., 3 K$\Omega$.

Figure 15:
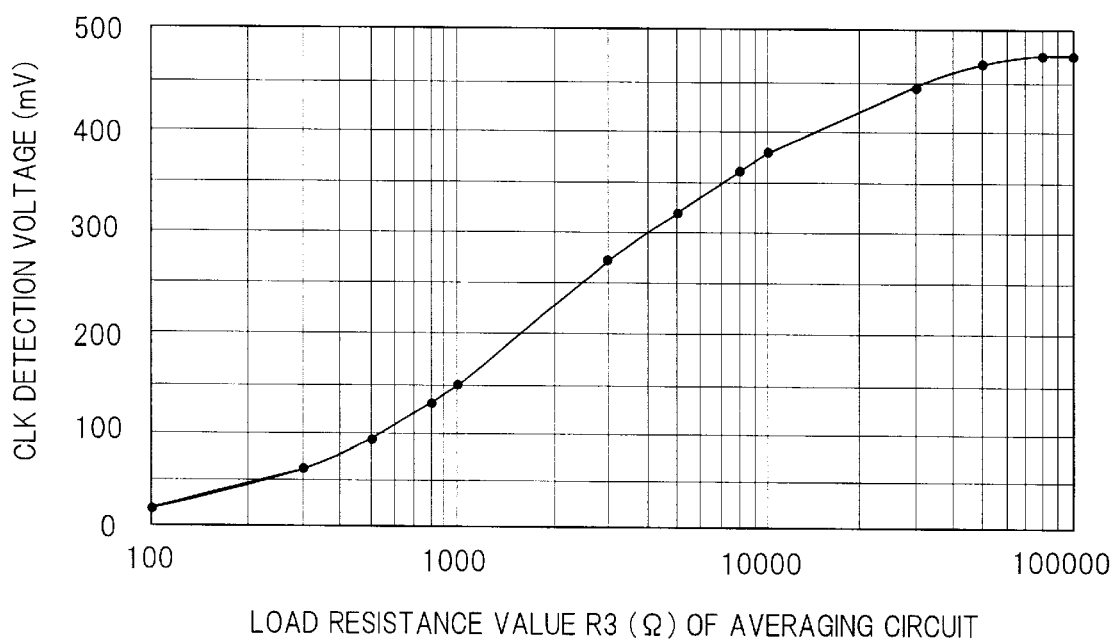
FIG. 15 is a diagram showing the relationship between the resistance value of an averaging circuit and clock detection voltage.
Figure 16:
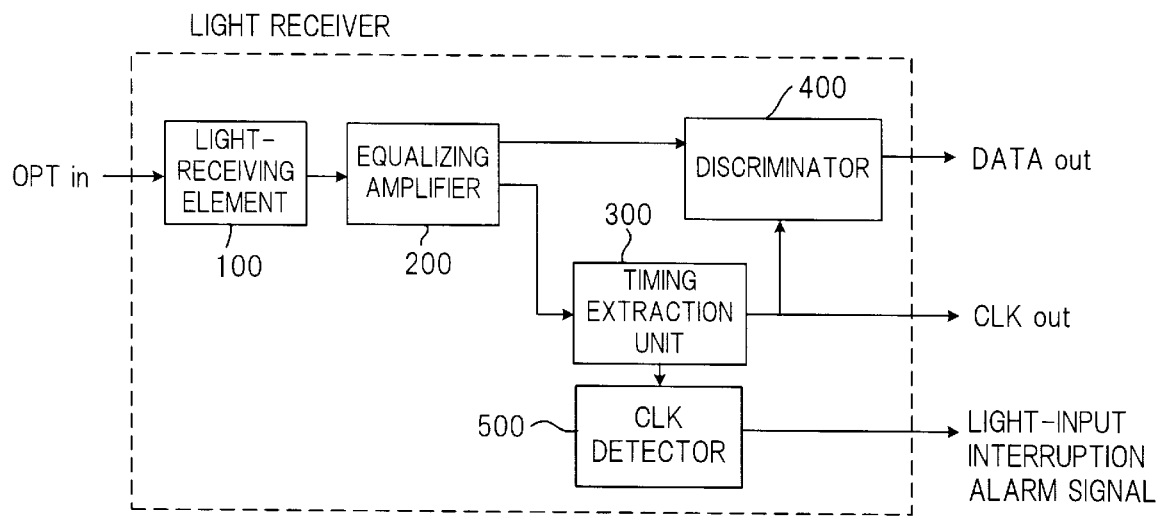
FIG. 16 is a block diagram showing the construction of a light receiver according to the prior art.
Figure 17:
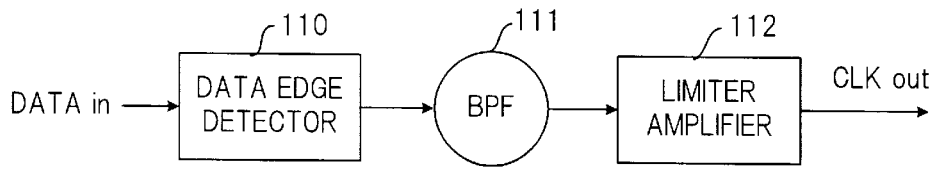
FIG. 17 is a block diagram showing the construction of a timing extraction unit according to the prior art.
Figure 18:
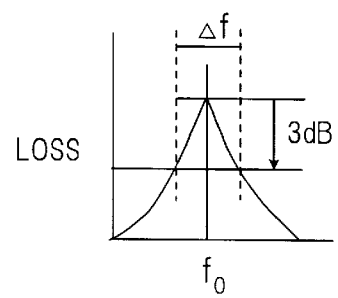
FIG. 18 is a characteristic diagram showing the f characteristic of a bandpass filter.
Figure 19:
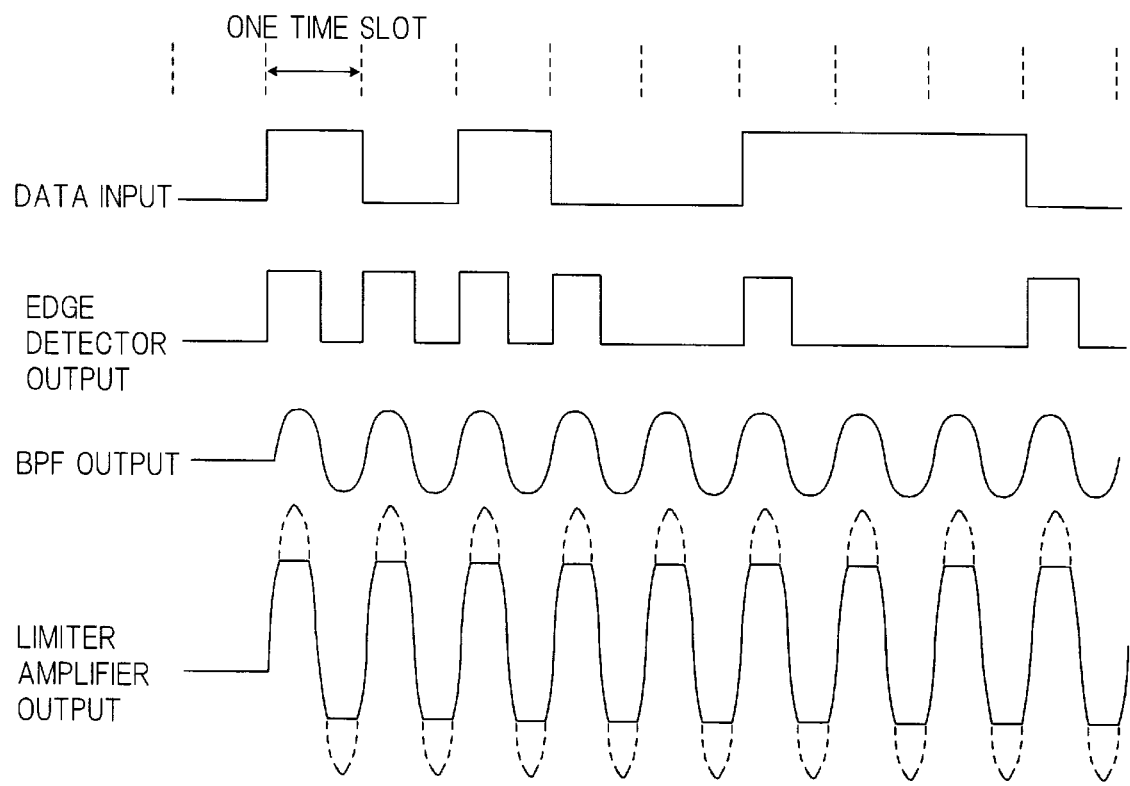
FIG. 19 is a time chart of the timing extraction unit according to the prior art.
Figure 20A:
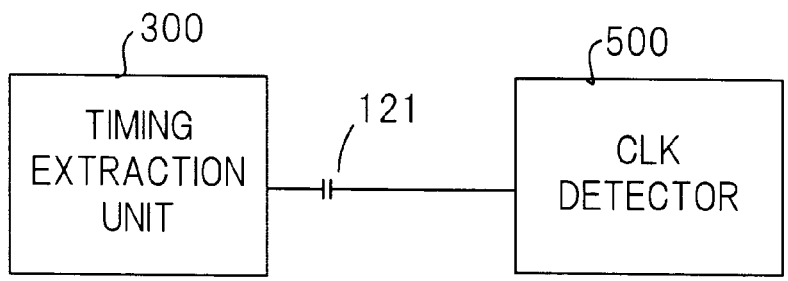
FIG. 20A is a diagram showing the connection between a timing extraction unit and a clock detector according to the prior art.
Figure 20B:
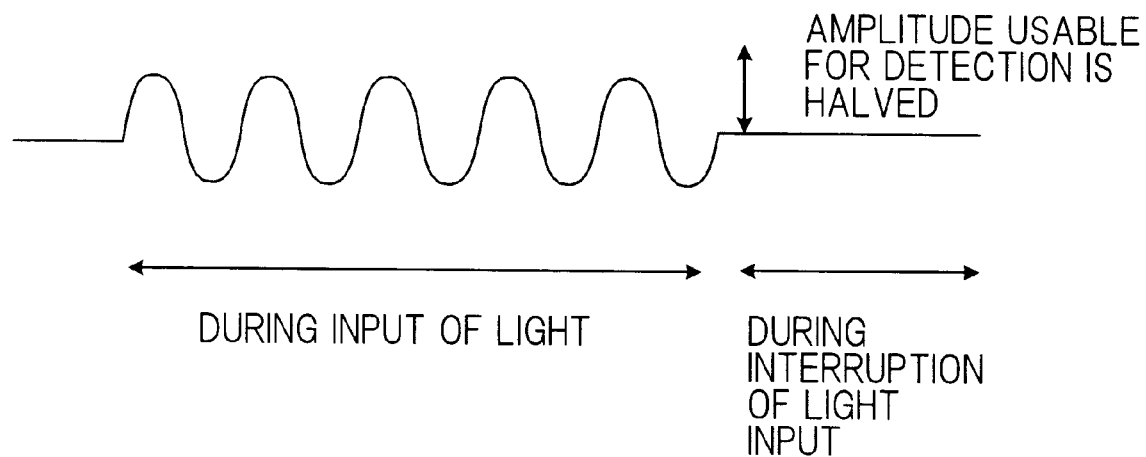
FIG. 20B is a diagram useful in describing the output waveform (at input of light and at interruption of the light input) of the timing extraction unit.

FIG. 15 is a characteristic diagram of clock detection voltage (mV) plotted against resistance value r3 ($\Omega$). It will be understood that if the resistance value r3 is made 30 k$\Omega$ or greater, then averaging circuit loss becomes substantially negligible. This is because the influence of the voltage dividing ratio of the reflecting resistor R2 is eliminated. That is, if r2 (the resistance value of resistor R2 serving as the reflecting load 13) and r3 (the resistance value of the resistor R3 of the averaging circuit 3) are decided so as to satisfy the following equations:

r2=10~100 times as large as the characteristic impedance $Z_O$ r3=ten or more times as large as r2 then a clock detection voltage commensurate with the clock signal amplitude can be produced as an output.

Thus, in accordance with the present invention, there is provided a clock detection circuit comprising a transmission circuit for transmitting a clock signal and a reflected signal obtained by reflecting the clock signal, and an averaging circuit provided on the output side of the transmission circuit, and the transmission circuit includes a diode to which a clock signal is input, a transmission line of impedance $Z_O$ having one end connected to the diode, and a reflecting load of impedance $Z_L$ ($Z_L \neq Z_O$) connected to the other end of the transmission line. The clock signal is amplified using reflection of the clock signal in the reflecting load, and the averaging circuit outputs a clock detection voltage. As a result, a DC voltage approximately equal to the amplitude value of the clock signal can be extracted. Moreover, supply of power other than ground basically is not required and it is possible to reduce power consumption. Moreover, it is possible to dispense with a costly amplifier or the like.

Further, in accordance with the present invention, it is possible to use any of a coaxial line, microstrip line, coplanar line or delay line, etc., as the transmission line. This makes it possible to construct a clock signal detection circuit simply and inexpensively.

Further, in accordance with the present invention, it is possible to construct a high-impedance reflecting-type clock signal detection circuit by using a resistor or impedance element as the reflecting load, connecting the resistor or inductance element serially to the other end of the transmission line, and capacity-grounding the other end of the resistor or inductance element. Alternatively, it is possible to construct a low-impedance reflecting-type clock signal detection circuit by using a capacitor as the reflecting load, connecting the capacitor serially to the other end of the transmission line, and grounding the other end of the capacitor. If necessary, clock signal detection circuits having a variety of constructions can be adopted.

In accordance with the present invention, by adopting 0.4 $\lambda$~0.43 $\lambda$ as the transmission line length of a high-impedance reflecting-type clock signal detection circuit and adopting 0.15 $\lambda$~0.20 $\lambda$ as the transmission line length of a low-impedance reflecting-type clock signal detection circuit, the clock detection voltages can be enlarged in each of these arrangements and the transmission line lengths can be decided with facility.

In accordance with the present invention, letting $Z_O$ represent the characteristic of the transmission line, r2 the reflecting resistance value and r3 the resistance value of the resistor in the averaging circuit, clock detection voltage can be enlarged by deciding the values of r2 and r3 so as to satisfy the following equations:

r2=10~100 times as large as $Z_O$ r3=ten or more times as large as r2

In accordance with the present invention, a clock detection voltage larger than the clock signal amplitude value can be output by adopting by adopting 0.4 $\lambda$~0.43 $\lambda$ as the transmission line length of a high-impedance reflecting-type clock signal detection circuit, using an inductance element as the reflecting load and setting the inductance of the inductance element to a suitable value.

Further, in accordance with the present invention, a clock detection voltage larger than the clock signal amplitude value can be output by adopting by adopting 0.15 $\lambda$~0.20 $\lambda$ as the transmission line length of a low-impedance reflecting-type clock signal detection circuit, using a capacitor as the reflecting load and setting the capacitance of the capacitor to a suitable value.

As many apparently widely different embodiments of the present invention can be made without departing from the spirit and scope thereof, it is to be understood that the invention is not limited to the specific embodiments thereof except as defined in the appended claims.

What is claimed is:

1. A clock signal detection circuit for detecting a clock signal, comprising:
   a transmission circuit for transmitting a clock signal and a reflected signal obtained by reflecting the clock signal; and
   an averaging circuit provided on the output side of said transmission circuit;
   said transmission circuit including:
      a diode to which a clock signal is input;
      a transmission line of impedance $Z_O$ having a first end connected to said diode; and
      a reflecting load of impedance $Z_L$ ($Z_L \neq Z_O$) having a first end connected to a second end of said transmission line; wherein
   the clock signal is amplified using reflection of the clock signal in said reflecting load, and said averaging circuit outputs a clock detection voltage.

2. The circuit according to claim 1, wherein said transmission line is constituted by any one of a coaxial line, a microstrip line, a coplanar line and a delay line.

3. The circuit according to claim 1, wherein a resistor serving as said reflecting load is serially connected at its first end to the second end of said transmission line, and a second end of said resistor is capacity-grounded.

4. The circuit according to claim 3, wherein said averaging circuit is connected to the second end of said resistor serving as the reflecting load, and said averaging circuit includes:
   an inductance element serially connected at its first end to said resistor, and a parallel circuit composed of a resistor and a capacitor connected between a second end of said inductance element and ground;
   the clock detection voltage being output from a point at which said inductance element and said parallel circuit are connected.

5. The circuit according to claim 4, wherein r2 and r3 are decided so as to satisfy the following equations:

r2=10~100 times as large as $Z_O$ r3=ten or more times as large as r2 where r2 represents a resistance value of the resistor serving as said reflecting load, and r3 represents a resistance value of the resistor in said averaging circuit.

6. The circuit according to claim 3, wherein said transmission line has a length of 0.4 $\lambda$~0.43 $\lambda$, where $\lambda$ represents the wavelength of the clock signal.

7. The circuit according to claim 1, wherein an inductance element serving as said reflecting load is serially connected at its first end to the second end of said transmission line, and a second end of said inductance element is capacity-grounded.

8. The circuit according to claim 7, wherein said averaging circuit is connected to the second end of said inductance element serving as the reflecting load, and said averaging circuit includes:
   a separate inductance element serially connected at its first end to said inductance element, and a parallel circuit composed of a resistor and a capacitor connected between a second end of said separate inductance element and ground;
   the clock detection voltage being output from a point at which said separate inductance element and said parallel circuit are connected.

9. The circuit according to claim 8, wherein said transmission line has a length of 0.4 $\lambda$~0.43 $\lambda$, where $\lambda$ represents the wavelength of the clock signal, and said inductance element has an inductance value decided so as to maximize the clock detection voltage.

10. The circuit according to claim 1, wherein a capacitor serving as said reflecting load is serially connected at its first end to the second end of said transmission line, and a second end of said capacitor is grounded.

11. The circuit according to claim 10, wherein said averaging circuit is connected in parallel with a capacitor serving as the reflecting load, and said averaging circuit includes:

an inductance element connected at its first end to one end of said capacitor, and a parallel circuit composed of a resistor and a capacitor connected between a second end of said inductance element and ground;

the clock detection voltage being output from a point at which said inductance element and said parallel circuit are connected.

12. The circuit according to claim 10, wherein said transmission line has a length of 0.15 $\lambda$~0.20 $\lambda$, where $\lambda$ represents the wavelength of the clock signal.

13. The circuit according to claim 12, wherein said capacitor has a capacitance value decided so as to maximize the clock detection voltage.

* * * * *